(12) United States Patent
Zhang et al.

(10) Patent No.: US 9,831,124 B1
(45) Date of Patent: Nov. 28, 2017

(54) INTERCONNECT STRUCTURES

(71) Applicant: GLOBALFOUNDRIES INC., Grand Cayman (KY)

(72) Inventors: Xunyuan Zhang, Albany, NY (US); Frank W. Mont, Troy, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 15/338,070

(22) Filed: Oct. 28, 2016

(51) Int. Cl.
*H01L 21/67* (2006.01)
*H01L 21/768* (2006.01)
*H01L 23/522* (2006.01)
*H01L 23/532* (2006.01)

(52) U.S. Cl.
CPC .. *H01L 21/76886* (2013.01); *H01L 21/76802* (2013.01); *H01L 21/76849* (2013.01); *H01L 21/76877* (2013.01); *H01L 23/5226* (2013.01); *H01L 23/53209* (2013.01); *H01L 23/53228* (2013.01)

(58) Field of Classification Search
CPC ......... H01L 21/76895; H01L 21/02063; H01L 21/32134; H01L 23/53238; H01L 21/02362; H01L 21/31116; H01L 21/67069; H01L 21/76841; H01L 2224/05157

See application file for complete search history.

(56) References Cited

U.S. PATENT DOCUMENTS

| 8,685,867 | B1 | 4/2014 | Danek et al. |
| 2008/0026149 | A1 | 1/2008 | Tomasini et al. |
| 2009/0309227 | A1* | 12/2009 | King ............... H01L 21/76807 257/762 |
| 2014/0183738 | A1* | 7/2014 | Jezewski ............ H01L 23/485 257/751 |
| 2016/0314985 | A1* | 10/2016 | Yang .................. H01L 21/3081 |

FOREIGN PATENT DOCUMENTS

| JP | 5173140 | 8/2006 |
| JP | 2009539264 | 11/2009 |

* cited by examiner

*Primary Examiner* — Roy Potter
(74) *Attorney, Agent, or Firm* — Anthony Canale; Andrew M. Calderon; Roberts Mlotkowski Safran Cole & Calderon, P.C.

(57) ABSTRACT

The present disclosure relates to semiconductor structures and, more particularly, to interconnect structures and methods of manufacture. The structure includes: a cobalt metallization structure with a modified surface of etch chemistries; a layer of material on the modified surface; and an interconnect structure in direct contact with the material.

16 Claims, 4 Drawing Sheets

INTERCONNECT STRUCTURES

FIELD OF THE INVENTION

The present disclosure relates to semiconductor structures and, more particularly, to interconnect structures and methods of manufacture.

BACKGROUND

Interconnect structures are used in semiconductor manufacturing to connect active and passive devices or structures at different wiring levels of the chip. Interconnect structures can be of composed of different metal or metal alloy materials such as, e.g., tungsten (W) or copper (Cu). For example, middle of the line processes typically include tungsten; whereas, back end of the line processes typically include copper.

By virtue of continued scaling of device technologies, interconnect structures need to be reduced in size. For example, interconnect structures with dimensions of less than 30 nm are now required in many semiconductor processes. As the interconnect structures scale downwards, different metals or metal alloys are required with lower resistivities in order to improve device performance. To this end, cobalt (Co) is currently being explored and/or used as an alternative to tungsten or copper, as the resistivity of cobalt is lower than copper and tungsten at smaller dimensional sizes. Cobalt, though, poses a challenge during etching and wet cleaning processes. For example, reactive ion etching (RIE) processes modify the surface of the cobalt with oxygen or fluorine and subsequent etching and wet clean processes (e.g., dHF processes) tend to dissolve the cobalt, e.g., modified surface of the cobalt, damaging the interconnect structure.

SUMMARY

In an aspect of the disclosure, a structure comprises: a cobalt metallization structure with a modified surface of etch chemistries; a layer of material on the modified surface; and an interconnect structure in direct contact with the material.

In an aspect of the disclosure, a structure comprises: an insulator layer; a metallization structure composed of cobalt, a barrier liner and a modified surface on the cobalt, formed in a trench of the insulator layer; a layer of material formed on the modified surface; a capping layer on the insulator layer; and an interconnect structure formed through an opening in the capping layer and in direct contact with the layer of material.

In an aspect of the disclosure, a method comprises: forming a metallization structure in an insulator layer; forming a capping layer and insulator layer over the metallization structure; etching a trench into the insulator layer and capping layer to expose a surface of the metallization structure, which results in a modified surface of the metallization structure; forming a material over the modified surface; and depositing an interconnect structure in the trench and in direct contact with the material.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to interconnect structures and methods of manufacture. More specifically, the present disclosure relates to cobalt (Co) interconnect structures which are compatible with etch and wet clean processes. Advantageously, the structures and methods disclosed herein prevent any significant damage from occurring to the interconnect structure (metallization structure) during etching and wet clean processes, resulting in improved interconnect reliability and yields.

In more specific embodiments, the present disclosure provides structures and methods which solve the problem of interaction between Co interconnect structures subjected to etching and wet clean processes. For example, in embodiments, metallization structures can undergo a trisilylamine (TSA) treatment to protect the metallization structure during subsequent etching and wet clean processes. In alternative embodiments, a pristine metal material, e.g., Ru or Co, can be formed on the exposed surface of the metallization structure to prevent damage from occurring during subsequent etching and wet clean processes. In still further embodiments, Co or Ru or other metal resistive to etching and clean processes can be grown on the surface of the metallization structure followed by a silicide process to prevent damage from occurring during subsequent etching and wet clean processes. In each of these embodiments, the surface of the metallization structure will be modified, post etching processes, to prevent damage from occurring to the metallization structure during subsequent etching and wet clean processes. These processes and structures will thus improve interconnect structure reliability and yield.

The metallization structure of the present disclosure can be manufactured in a number of ways using a number of different tools. In general, though, the methodologies and tools are used to form structures with dimensions in the micrometer and nanometer scale. The methodologies, i.e., technologies, employed to manufacture the metallization structure of the present disclosure have been adopted from integrated circuit (IC) technology. For example, the structures are built on wafers and are realized in films of material patterned by photolithographic processes on the top of a wafer. In particular, the fabrication of the metallization structure uses three basic building blocks: (i) deposition of thin films of material on a substrate, (ii) applying a patterned mask on top of the films by photolithographic imaging, and (iii) etching the films selectively to the mask.

Figure 1:
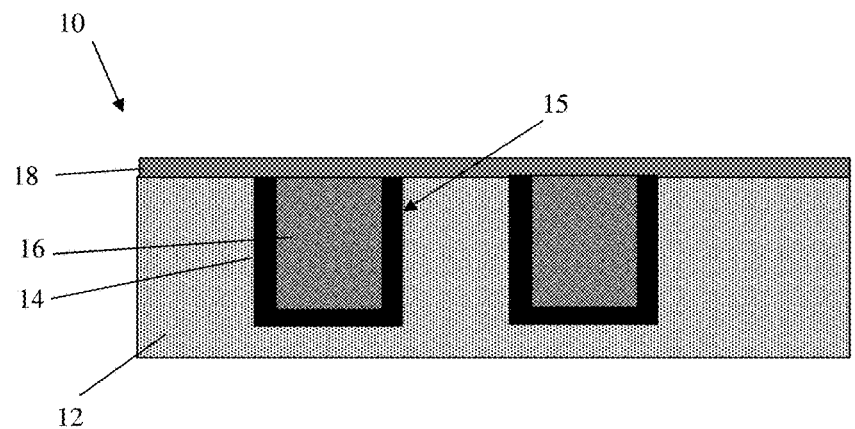
FIG. 1 shows a structure and respective fabrication processes in accordance with aspects of the present disclosure.

FIG. 1 shows a structure and respective fabrication processes in accordance with aspects of the present disclosure. More specifically, the structure 10 includes one or more metallization structures 15 formed in an insulating material 12. In embodiments, the metallization structures 15 can be wiring structures or interconnect structures. The insulating material 12 can be an oxide based material and the metallization structures 15 can include a barrier liner material 14, e.g., TiN, and a conductive material 16, e.g., cobalt. A capping layer 18 can be deposited on the surface of the insulating material 12 and the metallization structures 15. In embodiments, the capping layer 18 can be SiN and, in embodiments, the SiN can be doped with carbon or hydrogen.

In embodiments, the metallization structures 15 are formed by conventional lithography, etching and deposition methods known to those of skill in the art. For example, a resist formed over the insulating material 12 is exposed to energy (light) to form a pattern (opening). An etching process with a selective chemistry, e.g., reactive ion etching (RIE), will be used to form one or more trenches in the insulating material through the openings of the resist. The resist can then be removed by a conventional oxygen ashing process or other known stripants. Following the resist removal, the barrier liner material 14 can be deposited on the sidewalls and bottom of the trench, following by deposition of the interconnect material 16. The deposition of the materials 14, 16 can be applied by any conventional deposition processes, e.g., chemical vapor deposition (CVD) processes. Any residual material 14, 16 on the surface of the insulating material 12 can be removed by conventional chemical mechanical polishing (CMP) processes.

Figure 2:
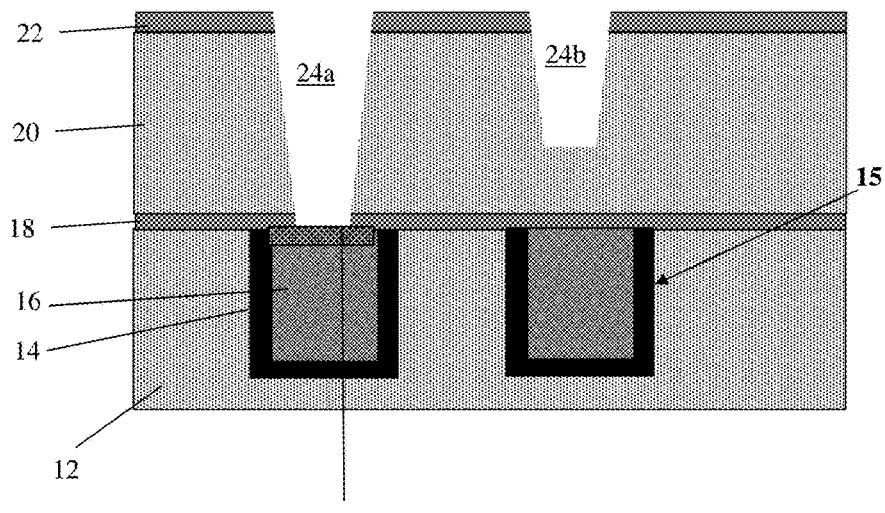
FIG. 2 shows trenches and a modified surface of a metallization structure and respective fabrication processes in accordance with aspects of the present disclosure.

In FIG. 2, an insulator material 20 is deposited on the capping layer 18, following by a deposition of a hardmask material 22. In embodiments, the insulator material 20 can be an interlevel dielectric layer, e.g., oxide material, and the hardmask material 22 can be a nitride layer and more specifically TiN. The insulator material 20 and the hardmask material 22 can be deposited by conventional CVD and plasma vapor deposition (PVD) processes, respectively.

Still referring to FIG. 2, trenches 24a, 24b are formed through the insulator material 20 and the hardmask material 22. In embodiments, the trench 24a is a deep trench structure which is also formed through the capping layer 18, exposing a surface of the underlying metallization structure 15. In embodiments, the trenches 24a, 24b can be formed by conventional lithography and etching processes, e.g., RIE process with selective chemistries to the insulator material and the capping/hardmask layers, using separate etching steps to obtain different depths as one example. It should be understood that during the formation of the trench 24a, the RIE chemistries will modify the surface of the exposed surface of the metallization structure 15, e.g., cobalt. More specifically, the surface of the conductive material 16 of the metallization structure 15 will be modified with at least one of fluorine, carbon and oxygen, as represented by reference numeral 26.

Figure 3:
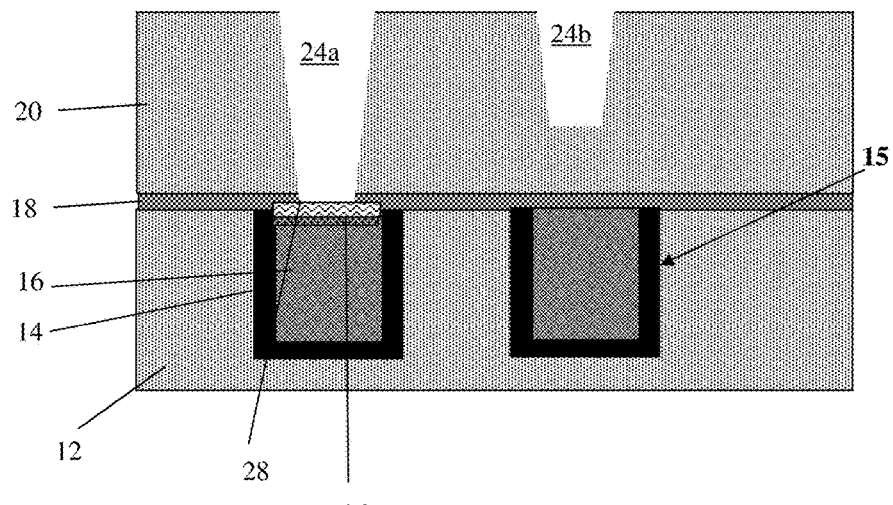
FIG. 3 shows a protective layer on the modified surface of the metallization structure and respective fabrication processes in accordance with aspects of the present disclosure.

In FIG. 3, the hardmask layer 22 can be removed by conventional RIE processes, which can also affect the surface of the underlying metallization structure 15, e.g., modified surface 26. The modified surface 26 of the metallization structure 15 will then undergo a trisilylamine (TSA) treatment to increase resistivity of wet chemical attack for interconnect structures. More specifically, the modified surface 26 will be subjected to a trisilylamine treatment at, e.g., a temperature of about 350° C. with a time of about, e.g., 1 minute to about 5 minutes, to form a protective cobalt silicide layer 28. In embodiments, the protective cobalt silicide layer 28 will protect the metallization structures 15 and, more specifically, the Co material 16 during subsequent etching and wet clean processes, e.g., hardmask (e.g., TiN) removal, DI water and dHF chemistries, to remove the hardmask and etch residuals. In this way, the Co material 16 of the metallization structures 15 will not be damaged during the wet clean processes.

Figure 4:
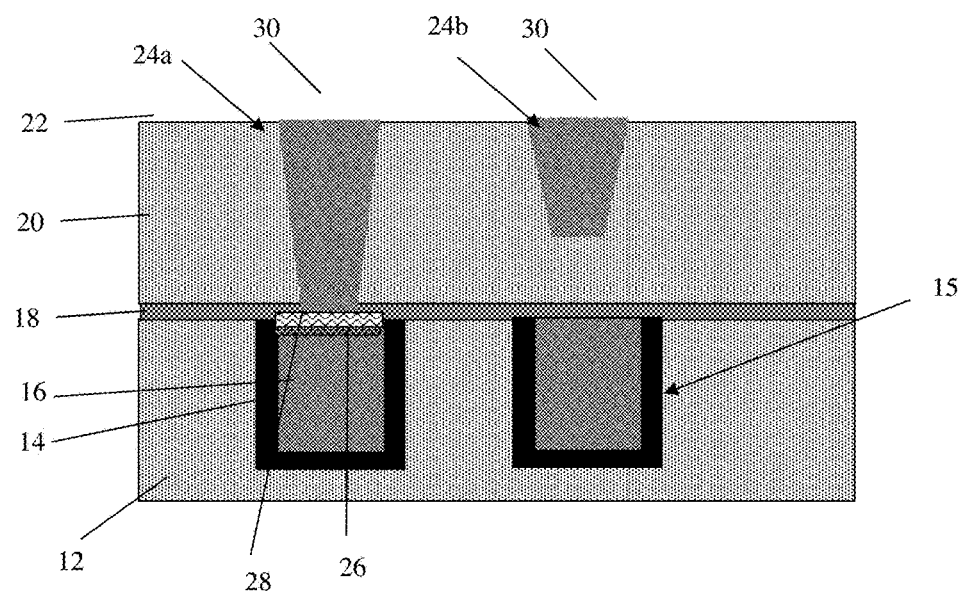
FIG. 4 shows upper interconnect structures formed in the trenches and respective fabrication processes in accordance with aspects of the present disclosure.

As shown in FIG. 4, the trenches 24a and 24b are filled with metal material 30 to form upper level interconnect structures. It should be understood by those of skill in the art that at least the level interconnect structure formed in the trench 24a will be in direct contact with the lower interconnect structure e.g., metallization structure 15, and more specifically the cobalt silicide layer 28. In embodiments, the metal material can be Co or copper, to name a few contemplated materials. The metal material 30 can be deposited by a conventional deposition method, e.g., CVD and/or PVD and/or atomic layer deposition (ALD), followed by a conventional planarization process, e.g., CMP.

Figure 5:
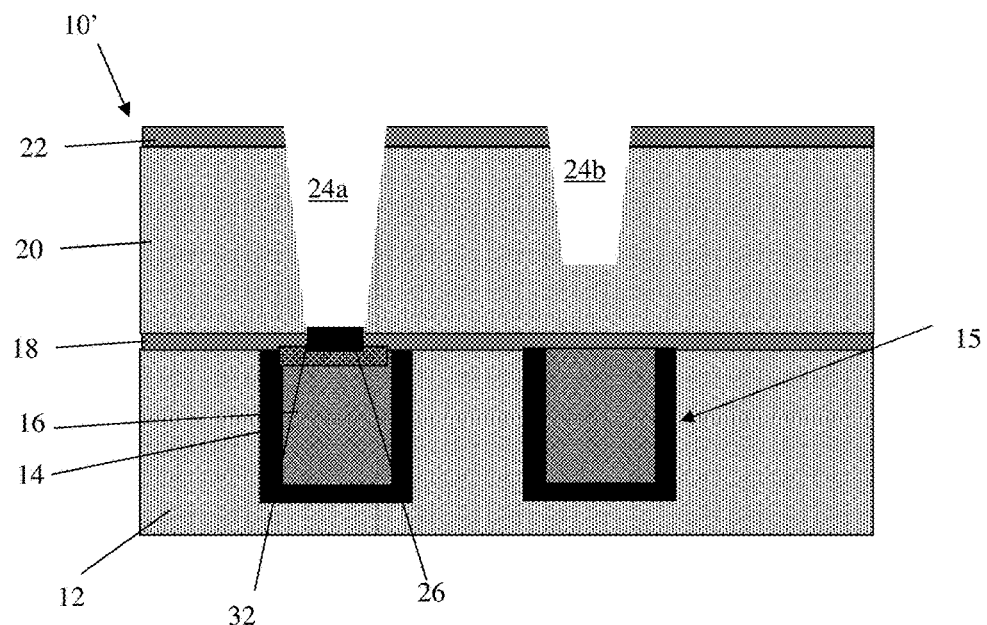
FIGS. 5 and 6 show structures and respective fabrication processes in accordance with alternative aspects of the present disclosure.
Figure 6:
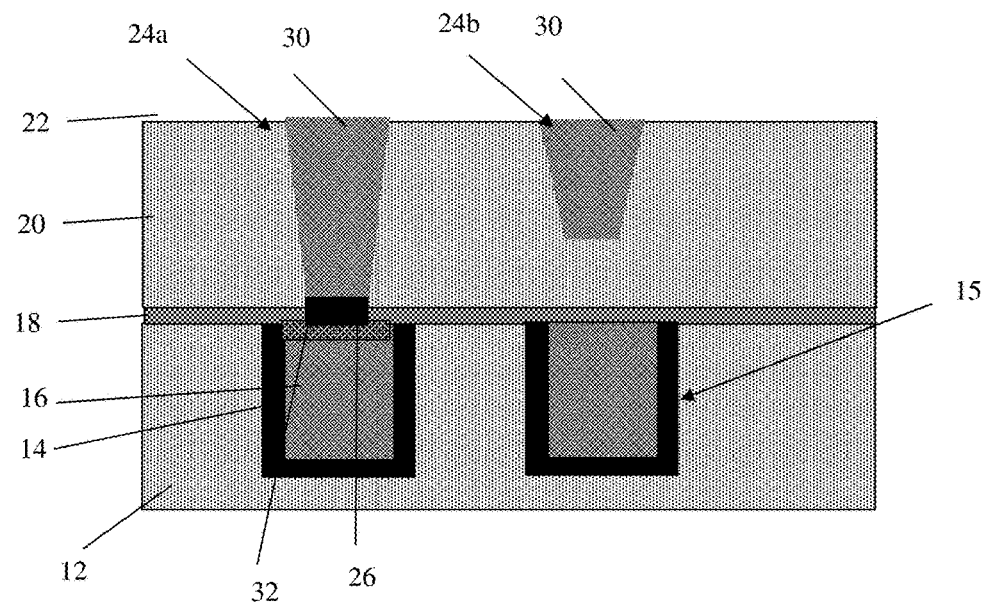

FIGS. 5 and 6 show alternative structures and respective fabrication processes in accordance with alternative aspects of the present disclosure. Starting from the structure shown in FIG. 2, in the structure 10' of FIG. 5 a pristine layer of metal 32 can be deposited within the trench 24a and on the exposed surface of the Co material 16 and, more specifically, the modified region 26. In embodiments, the protective layer of metal 32 can be Ru or Co, for example, grown by a CVD or electroless processes. The protective layer of metal 32 can have a thickness of about 3 nm to about 15 nm and more preferably about 5 nm; although other dimensions are also contemplated herein which would provide protection to the interconnect structure 15 during subsequent etching and wet clean processes.

Similar to the embodiments described herein, the protective layer of metal 32 will protect the metallization structures 15 and, more specifically, the Co material 16 during subsequent etching and wet clean processes, e.g., hardmask (e.g., TiN) removal, DI water and dHF chemistries, to remove the hardmask and etch residuals, as shown in FIG. 5. In this way, the Co material 16 of the metallization structures 15 will not be damaged during the wet clean processes.

As shown in FIG. 6, the trenches 24a and 24b are filled with metal material 30 to form upper level interconnect structures. It should be understood by those of skill in the art that at least the level interconnect structure formed in the trench 24a will be in direct contact with the lower metallization structure 15, and more specifically the protective layer of metal 32 of the lower metallization structure 15. In embodiments, the metal material can be Co or copper, to name a few contemplated materials, deposited by, e.g., CVD and/or PVD and/or ALD processes, followed by a conventional planarization process, e.g., CMP.

Figure 7:
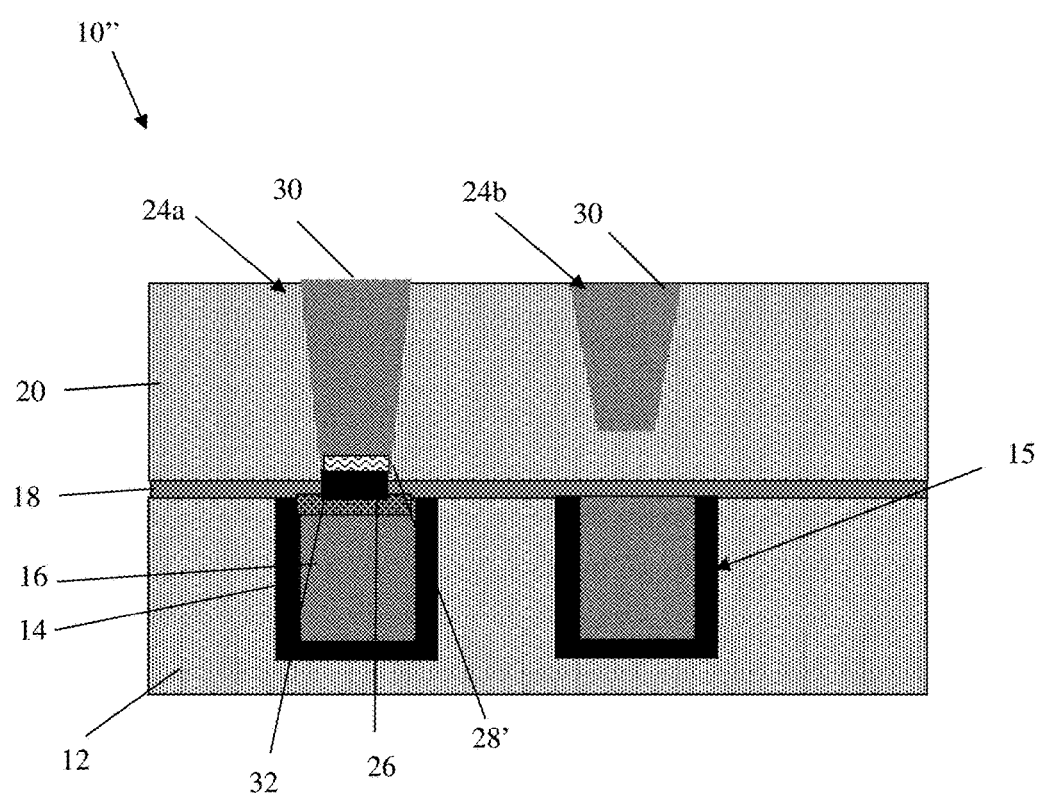
FIG. 7 shows another structure and respective fabrication processes in accordance with alternative aspects of the present disclosure.

FIG. 7 shows another alternative structure and respective fabrication processes in accordance with alternative aspects of the present disclosure. More specifically, in the structure 10'' of FIG. 7, a pristine layer of metal 32 can be deposited within the trench 24a and on the exposed surface of the Co material 16 and, more specifically, the modified region 26. In embodiments, the protective layer of metal 32 can be Ru or Co, for example, grown by a CVD or electroless process. The protective layer of metal 32 can have a thickness of about 3 nm to about 15 nm and more preferably about 5 nm; although other dimensions are also contemplated herein which would provide protection to the interconnect structure 15 during subsequent etching and wet clean processes. As further shown in FIG. 7, the protective layer of metal 32 can then undergo a trisilylamine (TSA) treatment to form a silicide layer 28' on top of the pristine layer 26 comprised of Co or Ru.

Similar to the embodiments described herein, the combination of the protective layer of metal 32 and silicide layer 28' will protect the metallization structures 15 and, more specifically, the Co material 16 during subsequent etching and wet clean processes, e.g., hardmask (e.g., TiN) removal, DI water and dHF chemistries, to remove the hardmask and etch residuals, as shown in FIG. 5. In this way, the Co material 16 of the metallization structures 15 will not be damaged during the wet clean processes.

Still referring to FIG. 7, the trenches 24a and 24b are filled with metal material 30 to form upper level interconnect structures. It should be understood by those of skill in the art that at least the level interconnect structure formed in the trench 24a will be in direct contact with the lower interconnect structure e.g., metallization structure 15, and more specifically the protective silicide layer 28'. In embodiments, the metal material can be Co or copper, to name a few contemplated materials, deposited by e.g., CVD and/or PVD and/or ALD, followed by a conventional planarization process, e.g., CMP.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
   a cobalt metallization structure with a modified surface of etch chemistries;
   a layer of material on the modified surface; and
   an interconnect structure in direct contact with the material,
   wherein the cobalt metallization structure includes a barrier liner material.

2. The structure of claim 1, wherein the modified surface of etch chemistries is at least one of fluorine, oxygen and carbon.

3. The structure of claim 2, wherein the interconnect structure is composed of cobalt or copper.

4. The structure of claim 2, wherein the material is cobalt silicide.

5. The structure of claim 2, wherein the material is one of cobalt and ruthenium.

6. The structure of claim 5, wherein the material further comprises a silicide of cobalt or ruthenium.

7. A structure, comprising:
   an insulator layer;
   a metallization structure composed of cobalt, a barrier liner and a modified surface on the cobalt, formed in a trench of the insulator layer;
   a layer of material formed on the modified surface;
   a capping layer on the insulator layer; and
   an interconnect structure formed through an opening in the capping layer and in direct contact with the layer of material.

8. The structure of claim 7, wherein the modified surface is at least one of fluorine, oxygen and carbon.

9. The structure of claim 8, wherein the layer of material is cobalt silicide.

10. The structure of claim 8, wherein the layer of material is one of cobalt and ruthenium.

11. The structure of claim 10, wherein the layer of material further comprises a silicide of cobalt or ruthenium.

12. A method comprising:
    forming a metallization structure in an insulator layer;
    forming a capping layer and insulator layer over the metallization structure;
    etching a trench into the insulator layer and capping layer to expose a surface of the metallization structure, which results in a modified surface of the metallization structure;
    forming a material over the modified surface; and
    depositing an interconnect structure in the trench and in direct contact with the material,
    wherein the material is one of:
       a silicide;
       cobalt deposited by an electroless or growth process on the modified surface; and
       ruthenium deposited by an electroless or growth process on the modified surface.

13. The method of claim 12, wherein the silicide is formed by a trisilylamine (TSA) treatment post etching process and prior to a wet clean process.

14. The method of claim 12, further comprising performing a silicide process on the cobalt to form a cobalt silicide layer.

15. The method of claim 12, further comprising performing a silicide process on the ruthenium to form a ruthenium silicide layer.

16. The method of claim 12, wherein the interconnect structure is cobalt or copper.

* * * * *